United States Patent
Morimoto et al.

(10) Patent No.: US 8,846,449 B2
(45) Date of Patent: Sep. 30, 2014

(54) THREE-DIMENSIONAL INTEGRATED CIRCUIT, PROCESSOR, SEMICONDUCTOR CHIP, AND MANUFACTURING METHOD OF THREE-DIMENSIONAL INTEGRATED CIRCUIT

(75) Inventors: Takashi Morimoto, Osaka (JP); Takeshi Nakayama, Hyogo (JP); Takashi Hashimoto, Fukuoka (JP)

(73) Assignee: Panasonic Corporation, Osaka (JP)

( * ) Notice: Subject to any disclaimer, the term of this patent is extended or adjusted under 35 U.S.C. 154(b) by 223 days.

(21) Appl. No.: 13/637,729

(22) PCT Filed: Apr. 2, 2012

(86) PCT No.: PCT/JP2012/002260
§ 371 (c)(1),
(2), (4) Date: Sep. 27, 2012

(87) PCT Pub. No.: WO2012/157167
PCT Pub. Date: Nov. 22, 2012

(65) Prior Publication Data
US 2013/0037965 A1   Feb. 14, 2013

(30) Foreign Application Priority Data

May 17, 2011   (JP) .................. 2011-110027

(51) Int. Cl.
  *H01L 21/44* (2006.01)
  *H01L 23/48* (2006.01)
  *H01L 27/06* (2006.01)
  *H01L 25/065* (2006.01)
  *H01L 23/528* (2006.01)

(52) U.S. Cl.
  CPC ... *H01L 23/5286* (2013.01); *H01L 2225/06544* (2013.01); *H01L 2225/06558* (2013.01); *H01L 2224/48091* (2013.01); *H01L 27/0688* (2013.01); *H01L 2225/06565* (2013.01); *H01L 2224/48* (2013.01); *H01L 25/0657* (2013.01); *H01L 2224/73265* (2013.01); *H01L 23/481* (2013.01); *H01L 2224/16145* (2013.01); *H01L 2225/06527* (2013.01)
  USPC .......................................... 438/108; 257/777

(58) Field of Classification Search
  CPC .................. H01L 25/0657; H01L 2924/01079; H01L 33/40; H01L 29/2003
  USPC ......... 257/777–778, 686, 692, 774, 676, 750, 257/758; 438/108–109, 612, 629, 614, 617
  See application file for complete search history.

(56) References Cited

U.S. PATENT DOCUMENTS

| 6,707,157 | B2 * | 3/2004 | Hoshino ................. 257/773 |
| 2006/0157868 | A1 | 7/2006 | Katou |
| 2007/0001298 | A1 | 1/2007 | Ozawa et al. |
| 2007/0102820 | A1 | 5/2007 | Kimura |
| 2012/0112354 | A1 | 5/2012 | Hirano et al. |
| 2012/0223440 | A1 * | 9/2012 | Fujita ..................... 257/774 |

FOREIGN PATENT DOCUMENTS

| JP | 2003-338559 | 11/2003 |
| JP | 2005-244068 | 9/2005 |
| JP | 2006-202924 | 8/2006 |
| JP | 2007-134468 | 5/2007 |
| JP | 2010-278104 | 12/2010 |
| WO | 2005/122257 | 12/2005 |

OTHER PUBLICATIONS

International Search Report issued May 22, 2012 in corresponding International Application No. PCT/JP2012/002260.
Mark I. Montrose, "Purinto kairo no EMC sekkei", Ohmsha, Ltd., Nov. 1997, pp. 69-74 (with partial English translation).

* cited by examiner

*Primary Examiner* — Hoa B Trinh
(74) *Attorney, Agent, or Firm* — Wenderoth, Lind & Ponack, L.L.P.

(57) ABSTRACT

One aspect of the present invention is a three-dimensional integrated circuit 1 including a first semiconductor chip and a second semiconductor chip that are layered on each other, wherein each of (i) a wiring layer closest to an interface between the first and second semiconductor chips among wiring layers of the first semiconductor chip and (ii) a wiring layer closest to the interface among wiring layers of the second semiconductor chip includes a power conductor area and a ground conductor area, a layout of the power conductor area and the ground conductor area in the first semiconductor chip is the same as a layout of the power conductor area and the ground conductor area in the second semiconductor chip, and the power conductor area in the first semiconductor chip at least partially faces the ground conductor area in the second semiconductor chip with an insulation layer therebetween.

13 Claims, 12 Drawing Sheets

FIG. 2
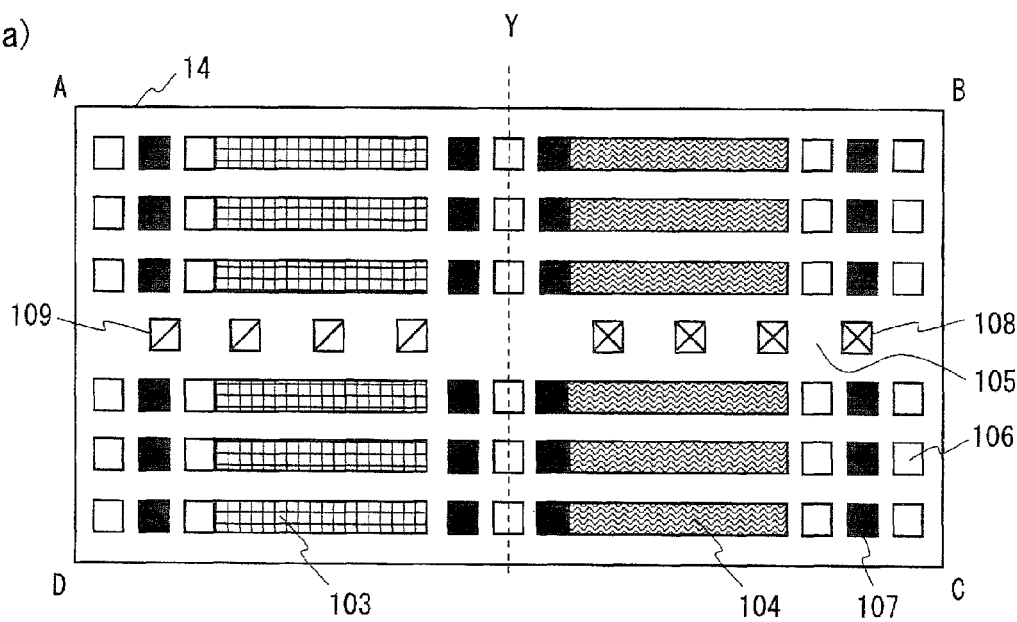
(a)
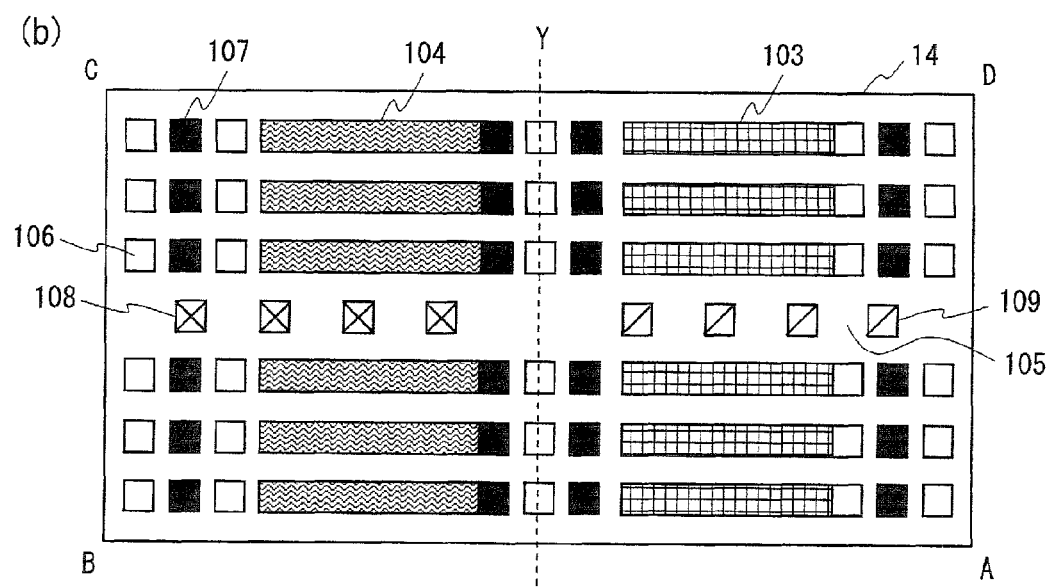
(b)
| | |
|---|---|
| ▦ | Power wiring pattern |
| ▨ | Ground wiring pattern |
| ⊠ | Transmission via |
| ⊡ | Reception via |
| ☐ | Power via |
| ■ | Ground via |

FIG. 5
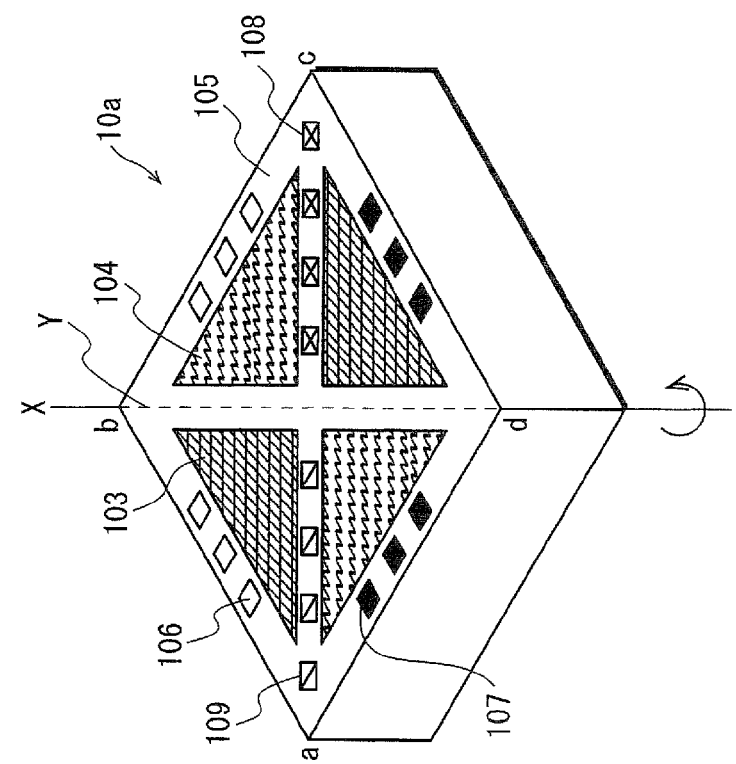
(b)
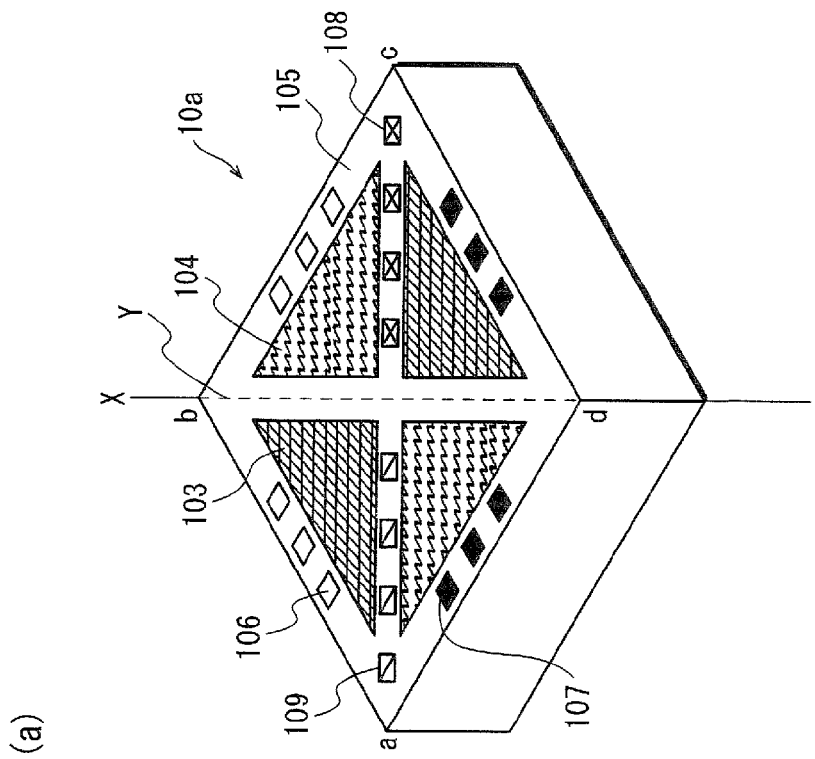
(a)

FIG. 6
(a)
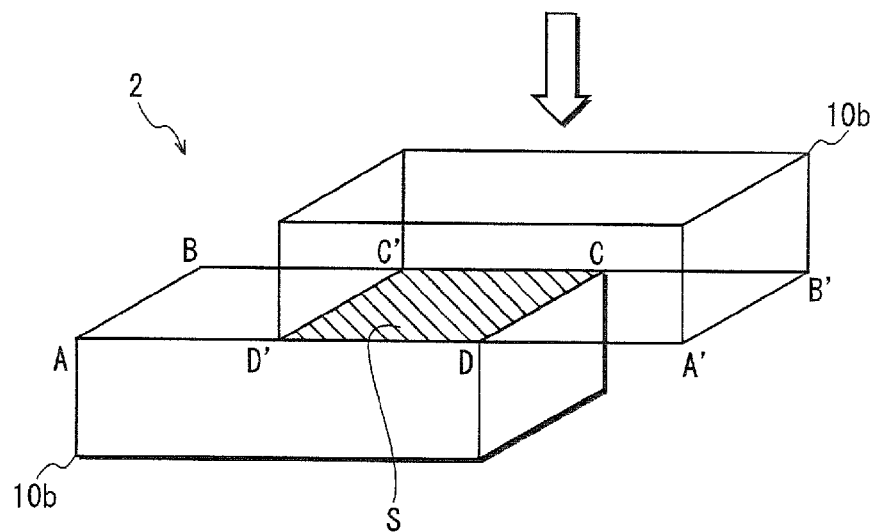
(b)
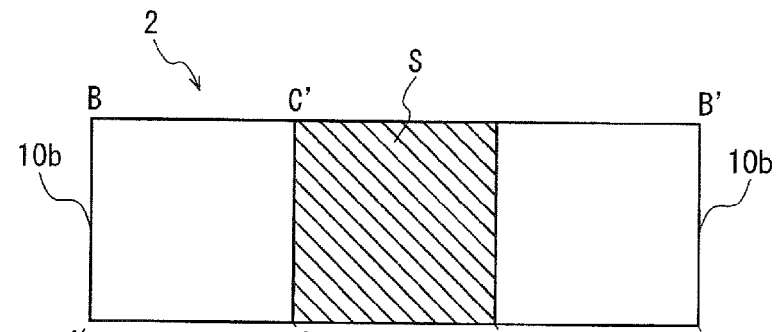
(c)
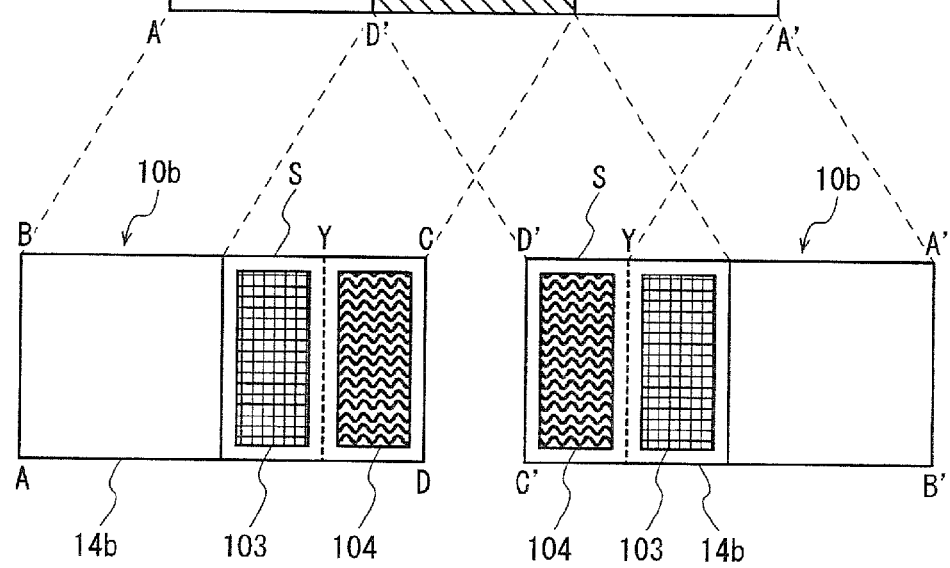

FIG. 7
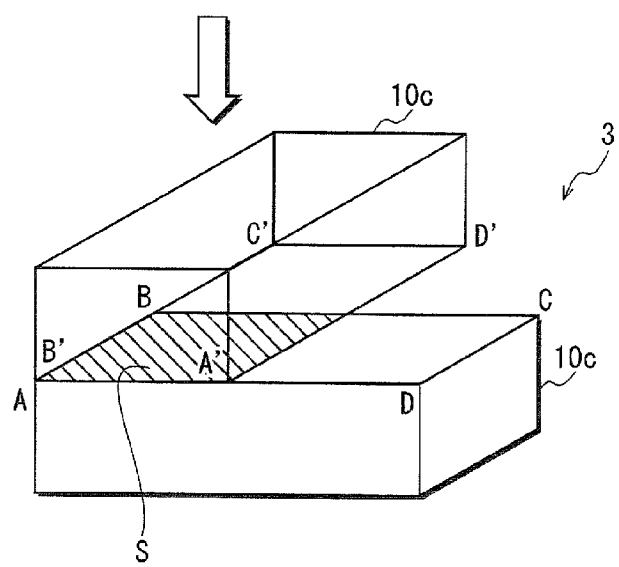
(a)
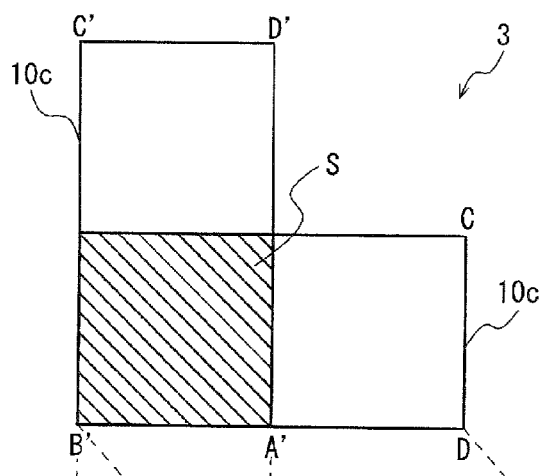
(b)
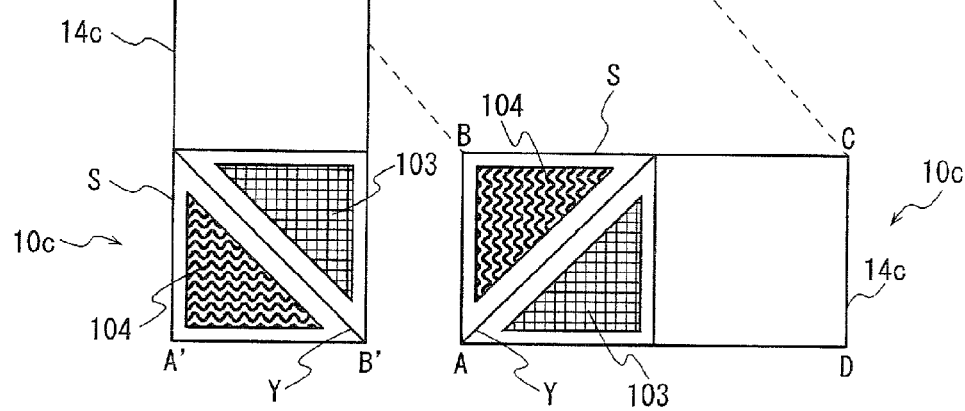
(c)

THREE-DIMENSIONAL INTEGRATED CIRCUIT, PROCESSOR, SEMICONDUCTOR CHIP, AND MANUFACTURING METHOD OF THREE-DIMENSIONAL INTEGRATED CIRCUIT

TECHNICAL FIELD

The present invention relates to a technique for stabilizing the supply voltage of a three-dimensional integrated circuit including a plurality of semiconductor chips that are layered on each other.

BACKGROUND ART

A so-called three-dimensional integrated circuit has the following structure. That is, a plurality of semiconductor chips are layered on each other, and a TSV (Through-Silicon Via), a microbump, or the like is used to connect the semiconductor chips.

The three-dimensional integrated circuit is formed by vertically layering a plurality of semiconductor chips on each other, and thus has a shorter wiring length than an integrated circuit formed by horizontally layering a plurality of semiconductor chips on each other. The power consumption of a circuit, which is proportional to an operating frequency, is reduced as the total wiring length of the circuit is shortened. For this reason, the three-dimensional integrated circuit is particularly useful in a processor having a high operating frequency.

In the three-dimensional integrated circuit, if the load on a semiconductor chip changes, the supply voltage of another semiconductor chip may drop. The drop in supply voltage is more likely to occur in a high-performance processor that consumes a large amount of current.

Accordingly, a capacitor is provided on a substrate on which the three-dimensional integrated circuit is mounted, so that the electric charge accumulated in the capacitor can compensate the voltage drop, and the voltage on the load is stabilized. Such a capacitor is referred to as "decoupling capacitor".

However, when the capacitor is provided on the substrate, the wiring from the capacitor to the load becomes long. As a result, the value of inductance becomes large. When the inductance is large, the amount of charge that flows into the load is decreased. In this case, the capacitor does not effectively serve as a decoupling capacitor.

Patent Literature 1 discloses a technique for arranging a decoupling capacitor in the vicinity of a load. A semiconductor device according to Patent Literature 1 is a layered semiconductor device including a plurality of chips that are layered on each other. Also, a film-like capacitor is provided between the chips so as to form a decoupling capacitor in the vicinity of each chip.

CITATION LIST

Patent Literature

[Patent Literature 1]
  Japanese Patent Application Publication No. 2005-244068
[Patent Literature 2]
  International Publication No. WO 2005/122257

Non-Patent Literature

[Non-Patent Literature 1]
  "Printed Circuit Board Design Techniques for EMC compliance" by Mark I. Montrose, Chapter 3, Ohmsha, Ltd.

SUMMARY OF INVENTION

Technical Problem

However, it is essential for the semiconductor device of Patent Literature 1 to include the film-like capacitor. Accordingly, the manufacturing method for this semiconductor device needs to additionally include a step for providing the film-like capacitor between the chips. This poses the problem of an increase in cost. Furthermore, according to the semiconductor device of Patent Literature 1, the area of contact between each chip and the film-like capacitor is large. This reduces yields and further increases cost.

The present invention has been achieved in view of the above problems, and an aim thereof is to provide a three-dimensional integrated circuit, a processor, a semiconductor chip, and a manufacturing method of the three-dimensional integrated circuit, the three-dimensional integrated circuit including a decoupling capacitor formed in the vicinity of the semiconductor chip without the need for a new structural member or an additional processing step.

Solution to Problem

In order to achieve the above aim, one aspect of the present invention is a three-dimensional integrated circuit including a first semiconductor chip and a second semiconductor chip that are layered on each other, wherein each of the first and second semiconductor chips includes a load layer and a plurality of wiring layers that are layered on each other, at least one of the first and second semiconductor chips includes an insulation layer for insulating the first and second semiconductor chips from each other at an interface therebetween, each of (i) a wiring layer closest to the interface among the wiring layers of the first semiconductor chip and (ii) a wiring layer closest to the interface among the wiring layers of the second semiconductor chip includes a power conductor area and a ground conductor area, a layout of the power conductor area and the ground conductor area in the wiring layer of the first semiconductor chip is the same as a layout of the power conductor area and the ground conductor area in the wiring layer of the second semiconductor chip, and the power conductor area in the wiring layer of the first semiconductor chip at least partially faces the ground conductor area in the wiring layer of the second semiconductor chip with the insulation layer therebetween.

Advantageous Effects of Invention

This makes it possible to form a decoupling capacitor inside the three-dimensional integrated circuit, without the need for a new structural member or an additional processing step. In other words, the decoupling capacitor formed inside the circuit can stabilize the supply voltage to the load.

BRIEF DESCRIPTION OF DRAWINGS

FIG. 2 shows a wiring pattern of a wiring layer 14.

FIG. 5 is for explaining a semiconductor chip 10a according to a modification.

FIG. 6 is for explaining a three-dimensional integrated circuit 2 according to a modification.

FIG. 7 is for explaining a three-dimensional integrated circuit 3 according to a modification.

DESCRIPTION OF EMBODIMENTS

1. Embodiment

The following describes a three-dimensional integrated circuit 1 according to an embodiment of the present invention.
<1-1. Outline>

The following describes a process through which the present inventors have arrived at a three-dimensional integrated circuit 1.

As described above, a decoupling capacitor needs to be arranged in the vicinity of a load so as to achieve its function more effectively. Patent Literature 2 discloses a technique for forming a decoupling capacitor in the vicinity of a load. A semiconductor device according to Patent Literature 2 is reduced in size, and has a structure where a first semiconductor chip including a first conductor layer faces, via an adhesive, a second semiconductor chip including a second conductor layer. In other words, the semiconductor device includes a decoupling capacitor made up of the first conductor layer, the second conductor layer, and the adhesive, where the first and second conductor layers serve as electrodes and the adhesive serves as a dielectric.

Meanwhile, some computers and home appliances may come in a plurality of types with different levels of performance with use of two semiconductor chips.

In the case of a computer, for example, one processor chip may be used for a low-end product, whereas two processor chips may be used for a high-end product so as to realize a multi-core processor. In the case of a recorder, one recorder chip may be used for a low-end product so as to realize simultaneous recording of two programs, whereas two recorder chips may be used for a high-end product so as to realize simultaneous recording to four programs. A three-dimensional layered structure is particularly suitable for such high-end products as described above, since the structure can support high-speed operations.

The present inventors found that the manufacturing cost for such a high-end product can be reduced by bonding two chips having the same structure to manufacture the product. Accordingly, the present inventors conducted research on a three-dimensional integrated circuit including two semiconductor chips having the same structure, and arrived at the three-dimensional integrated circuit 1. In the three-dimensional integrated circuit 1, a wiring pattern is devised such that a decoupling capacitor is formed in the vicinity of a load when two semiconductor chips are bonded to each other.
<1-2. Layered Structure>

Figure 1:
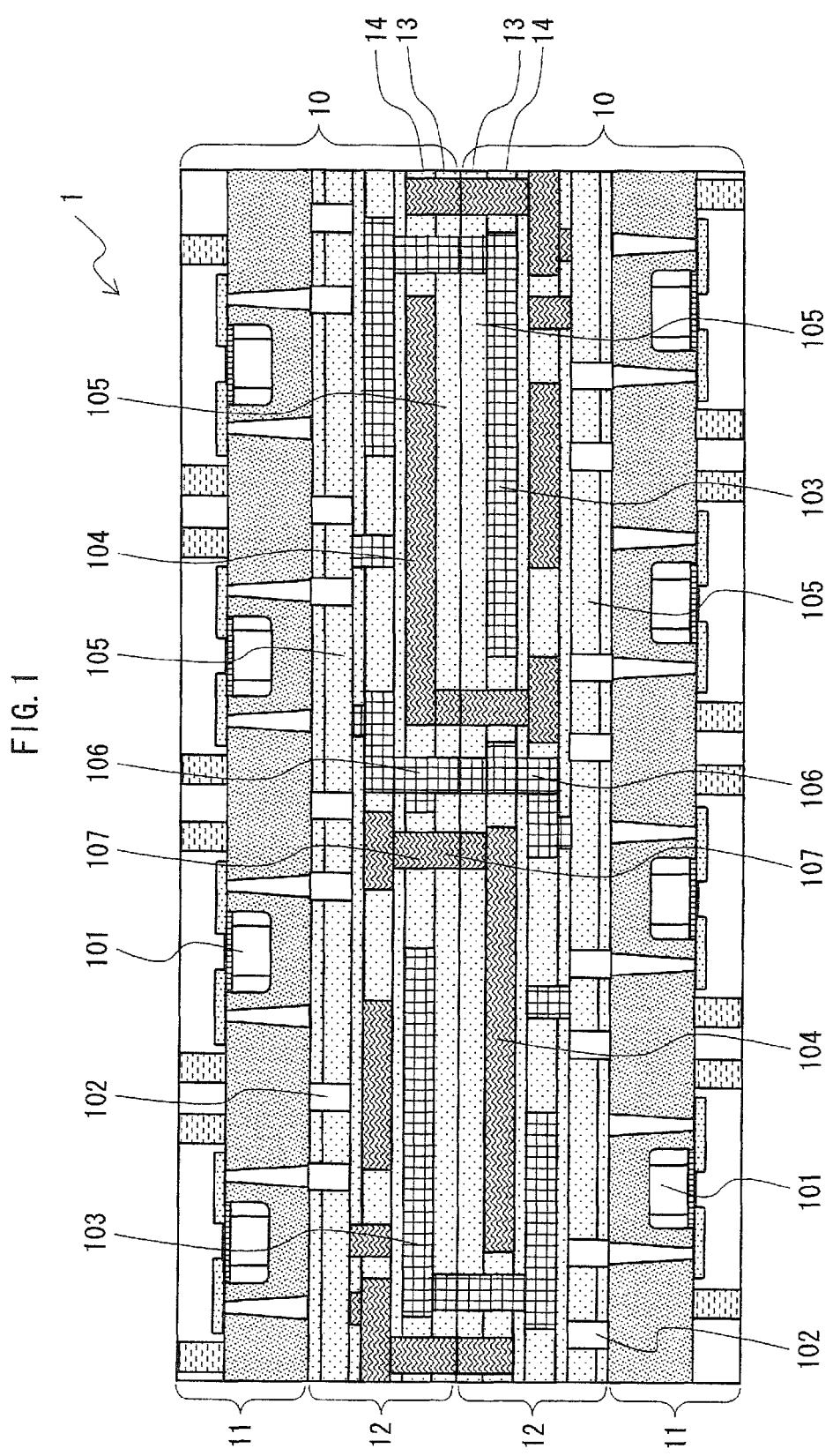
FIG. 1 is a schematic diagram showing a partial cross-section of a three-dimensional integrated circuit 1.

FIG. 1 is a schematic diagram showing a partial cross-section of the three-dimensional integrated circuit 1. The three-dimensional integrated circuit 1 includes two semiconductor chips 10 that are layered on each other.

Each of the semiconductor chips 10 is composed of a transistor layer 11 and a multilayer wiring layer 12. The transistor layer 11 includes an array of a plurality of MOS transistors 101. The multilayer wiring layer 12 includes: three wiring layers that are made of metal; and an insulation layer 13 that is a protection layer. The insulation layer 13 is directly layered on a wiring layer 14, which is one of the three wiring layers that is located closest to the interface with the other semiconductor chip 10. Note that the multilayer wiring layer 12 shown in FIG. 1 is merely an example, and may include even more wiring layers (e.g., approximately 7 to 12 layers).

The multilayer wiring layer 12 includes a wiring line 102, power conductor areas 103, ground conductor areas 104, and interlayer insulation films 105. The wiring line 102 connects the MOS transistors 101. The power conductor areas 103 and the ground conductor areas 104 provide supply voltage for the MOS transistors 101. The interlayer insulation films 105 provide electrical isolation between wiring lines. Also, the multilayer wiring layer 12 includes power vias 106 and ground vias 107 that are through-holes vertically interconnecting the wiring layers to each other and the chips to each other.

The thickness of the transistor layer 11 is approximately from 50 μm to 100 μm. The thickness of the multilayer wiring layer 12 is approximately from a few hundred nanometers (nm) to 1 μm. The thickness of the insulation layer 13 is approximately 10 μm. The diameter of each of the power vias 106 and the ground vias 107 is approximately a few micrometers (μm). Accordingly, the layers and vias shown in the sectional view of FIG. 1 are exaggerated in size.

Regarding the three-dimensional integrated circuit 1, the interlayer insulation film 105 included in each wiring layer and the insulation layer 13 is made of $SiO_2$. Note that wiring delay occurs if a capacitor (coupling capacitor) is formed between wiring lines in the wiring layers excluding the insulating layer 13. Accordingly, the interlayer insulation film 105 of each of the wiring layers excluding the insulating layer 13 may be made of a low dielectric (low-k material).

As shown in FIG. 1, in the three-dimensional integrated circuit 1, the power conductor areas 103 and the ground conductor areas 104 in the lower semiconductor chip 10 respectively face the ground conductor areas 104 and the power conductor areas 103 in the upper semiconductor chip 10 with two of the insulation layers 13 therebetween.

As described above, according to the three-dimensional integrated circuit 1, capacitors are formed by a bonding structure where the insulation layers 13 of the respective chips are sandwiched between the power conductor areas 103 and the ground conductor areas 104 that function as electrodes. The capacitors thus formed function as decoupling capacitors that provide supply voltage to the MOS transistors 101.

As described below, although each of the multilayer wiring layers 12 includes transmission vias and reception vias for transferring data between the chips, the transmission vias and the reception vias are not shown in the sectional view of FIG. 1.

<1-3. Wiring Pattern>

The following describes a wiring pattern with use of FIG. 2. The wiring pattern refers to a layout of the power conductor areas 103 and the ground conductor areas 104, which are formed in the wiring layer 14 of each semiconductor chip 10, and a layout of the vias, which are also formed in the wiring layer 14.

The insets (a) and (b) of FIG. 2 are each a plan view that schematically shows a wiring pattern of the wiring layer 14. FIG. 2(b) shows a wiring pattern rotated by 180 degrees in the plane of FIG. 2 from the state shown in FIG. 2(a).

As shown in FIG. 1, the wiring layer 14 is a wiring layer closest to the interface with the other chip, i.e., a wiring layer on which the insulation layer 13 is directly layered.

The wiring layer 14 includes the power conductor areas 103, the ground conductor areas 104, the power vias 106, the ground vias 107, transmission vias 108, and reception vias 109. The power vias 106 connect power between the chips. The ground vias 107 connect a ground between the chips. The transmission via 108 and the reception via 109 transfer data between the chips. Also, in the wiring layer 14, the interlayer insulation film 105 is formed in a portion other than portions where the power conductor areas 103, the ground conductor areas 104, and the vias are formed. The aforementioned vias are made of the same material and have the same structure. However, in the present specification, the vias are distinguished from each other with different names, i.e., "power via", "ground via", "transmission via", and "reception via", depending on the usage of each via. As shown in FIG. 1, the vias formed in the wiring layer 14 penetrate through the insulation layer 13.

As shown in FIG. 2(a), in the wiring layer 14, the power conductor areas 103 and the ground conductor areas 104 are arranged symmetrically to each other with respect to a center line parallel to a side AD and a side BC as being a symmetry axis Y.

The two semiconductor chips 10 are bonded to each other with the insulation layers 13 therebetween, in a manner that vertices A, B, C, and D of the wiring layer 14 shown in FIG. 2(a) respectively face vertices B, A, D, and C of the wiring layer 14 shown in FIG. 2(b). In this way, the power conductor areas 103 and the ground conductor areas 104 face each other with the insulation layers 13 therebetween. In other words, decoupling capacitors are formed inside the circuit.

Also, as shown in FIG. 2(a), in the wiring layer 14, the power vias 106 are arranged symmetrically to each other with respect to the center line parallel to the side AD and the side BC as being the symmetry axis Y. Also, in the wiring layer 14, the ground vias 107 are arranged symmetrically to each other with respect to the center line as the symmetry axis Y.

As described above, the two semiconductor chips 10 are bonded to each other with the insulation layers 13 therebetween, in a manner that the vertices A, B, C, and D of the wiring layer 14 shown in FIG. 2(a) respectively face the vertices B, A, D, and C of the wiring layer 14 shown in FIG. 2(b). In this way, the power vias 106 shown in FIG. 2(a) are connected to the power vias 106 shown in FIG. 2(b), and the ground vias 107 shown in FIG. 2(a) are connected to the ground vias 107 shown in FIG. 2(b). In other words, the power vias 106 do not make contact with the ground vias 107. This prevents the power from shorting out.

Also, in FIG. 2(a), in the wiring layer 14, the transmission vias 108 and the reception vias 109 are arranged symmetrically to each other with respect to the center line parallel to the side AD and the side BC as being the symmetry axis Y.

As described above, the two semiconductor chips 10 are bonded to each other with the insulation layers 13 (not shown in FIG. 2) therebetween, in a manner that the vertices A, B, C, and D of the wiring layer 14 shown in FIG. 2(a) respectively face the vertices B, A, D, and C of the wiring layer 14 shown in FIG. 2(b). In this way, the transmission vias 108 and the reception vias 109 shown in FIG. 2(a) are respectively connected to the reception vias 109 and the transmission vias 108 shown in FIG. 2(b). In other words, the upper semiconductor chip and the lower semiconductor chip can mutually transfer data.

<1-4 Manufacturing Method>

The following describes a manufacturing method of the three-dimensional integrated circuit 1.

The semiconductor chips 10 are manufactured as follows. The transistor layer 11 and the multilayer wiring layer 12 are formed on a silicon wafer through a repetition of a cleaning step, a film formation step, a lithography step, and an impurities diffusion step. Then, the power vias 106, the ground vias 107, the transmission vias 108, and the reception vias 109 are formed by means of a damascene method. Finally, the silicon wafer on which the layers and vias are formed is subjected to dicing, whereby the semiconductor chips 10 are manufactured.

The damascene method is a technique for forming fine copper (Cu) wiring lines, and at least includes the steps of: (1) forming a groove (via) in an interlayer insulation film; (2) forming a Ta barrier film in the groove; (3) forming a Cu seed film as an electrode for electrolytic plating; (4) embedding copper by electrolytic plating; and (5) CMP (Chemical Mechanical Polishing) which is a polishing step for removing copper that remains in portions, of the interlayer insulation film, other than the groove.

The three-dimensional integrated circuit 1 is manufactured by directly bonding the insulation layers 13 of the two semiconductor chips 10 manufactured as described above or, alternatively by bonding the insulation layers 13 with a microbump therebetween.

Figure 3:
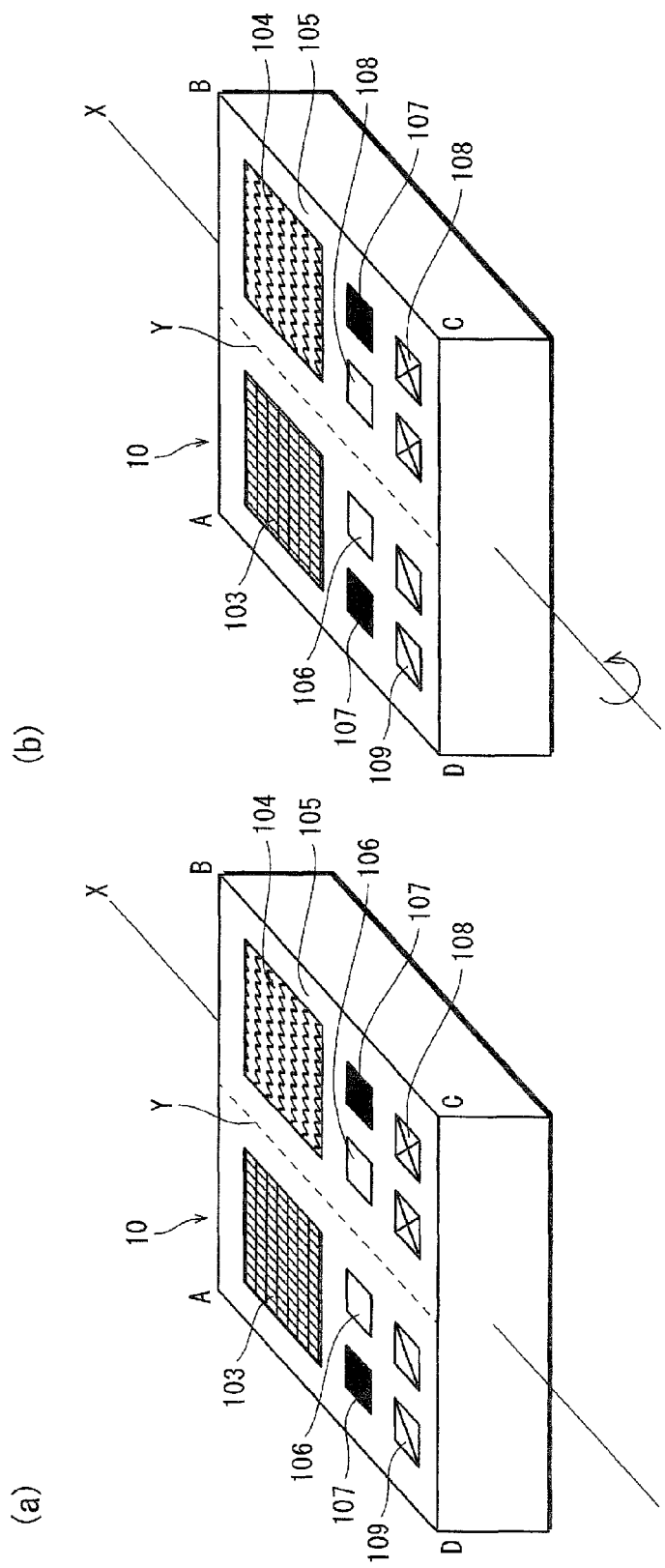
FIG. 3 is for explaining the wiring pattern of the wiring layer 14 and bonding between semiconductor chips 10.

FIG. 3 shows the semiconductor chips 10 of the same type in line. In the insets (a) and (b) of FIG. 3, the wiring pattern of the wiring layer 14 is simplified and the insulation layer 13 is not shown.

As described above, in the wiring layer 14, the power conductor area 103 and the ground conductor area 104 are arranged symmetrically to each other with respect to the center line parallel to the side AD and the side BC as being the symmetry axis Y. Also, in the wiring layer 14, the power vias 106 are arranged symmetrically to each other with respect to the center line as the symmetry axis Y. Also, in the wiring layer 14, the ground vias 107 are arranged symmetrically to each other with respect to the center line as the symmetry axis Y. Also, in the wiring layer 14, the transmission vias 108 and the reception vias 109 are arranged symmetrically to each other with respect to the center line as the symmetry axis Y.

The three-dimensional integrated circuit 1 is manufactured by flipping the semiconductor chip 10 shown in FIG. 3(b) upside down by rotating the semiconductor chip 10 about a center line X parallel to the symmetry axis Y, and thereafter bonding the semiconductor chip 10 thus rotated to the semiconductor chip 10 shown in FIG. 3(a).

Figure 4:
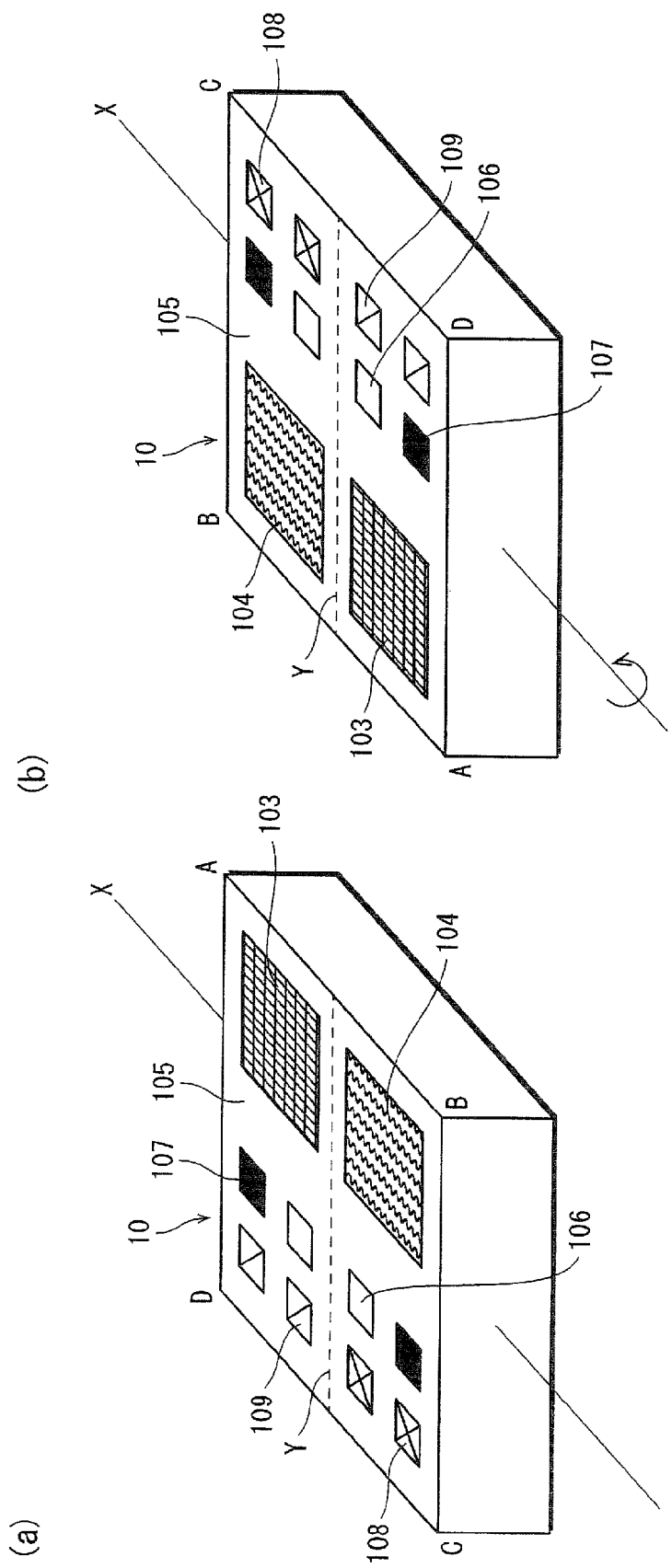
FIG. 4 is for explaining the wiring pattern of the wiring layer 14 and bonding between the semiconductor chips 10.

FIG. 4 shows the semiconductor chips 10 of the same type in line, similarly to FIG. 3. FIG. 4(b) shows the semiconductor chip 10 rotated by 180 degrees in the plane of FIG. 4 from the state shown in FIG. 4(a). In this case, the three-dimensional integrated circuit 1 is manufactured by flipping the semiconductor chip 10 shown in FIG. 4(b) upside down by rotating the semiconductor chip 10 about a center line X perpendicular to the symmetry axis Y, and thereafter bonding the semiconductor chip 10 thus rotated to the semiconductor chip 10 shown in FIG. 4(a).

As described above, the symmetric wiring pattern is formed on the wiring layer 14, and one of the two semiconductor chips 10, which are of the same type, is flipped upside down to be bonded to the other semiconductor chip 10. In this way, the decoupling capacitors, each being made up of the power conductor area 103, the ground conductor area 104, and the insulation layer 13, are formed inside the three-dimensional integrated circuit 1.

The three-dimensional integrated circuit 1 manufactured as described above is arranged on a substrate via an interposer, for example. The power conductor areas 103 and the ground conductor areas 104 in the three-dimensional integrated circuit 1 are respectively connected to a power circuit (regulator) and a ground electrode on the substrate.

<1-5. Effect>

As described above, the three-dimensional integrated circuit 1 includes the decoupling capacitors formed without the need for a new structural member or an additional processing step.

Furthermore, since the three-dimensional integrated circuit 1 is made up of the two semiconductor chips 10 of the same type that are bonded to each other, it is not necessary to manufacture multiple types of semiconductor chips during the manufacturing process. Instead, it is sufficient to manufacture only a single type of semiconductor chip. This reduces design cost.

Generally, as the area of a semiconductor chip increases, the probability increases that particles (dust) may be deposited on the chip during the manufacturing process. This reduces yields and increases the manufacturing cost. Accordingly, as seen in the three-dimensional integrated circuit 1, elements may be integrated into two semiconductor chips instead of all the elements being integrated into one semiconductor chip. This increases yields and reduces the manufacturing cost.

Also, forming the decoupling capacitors inside the three-dimensional integrated circuit 1 is effective in removing high-frequency noise. This is because of the following reason. In a case where decoupling capacitors are arranged outside the circuit, wiring lines are necessary from the decoupling capacitors to the power conductor areas 103 and the ground conductor areas 104. The wiring lines cause generation of inductor components. The resistance of the inductor components increases in proportion to a signal frequency. Therefore, if decoupling capacitors are formed outside a high-speed circuit such as a processor, they cannot effectively remove noise from the high-speed circuit.

In contrast, the three-dimensional integrated circuit 1 does not require such wiring lines, since the power conductor areas 103 and the ground conductor areas 104 themselves form the decoupling capacitors. Accordingly, even in a high-speed circuit, the decoupling capacitors formed as described above can effectively remove noise.

<2. Modifications>

Although the present invention has been described based on the above embodiment, the present invention is of course not limited to the three-dimensional integrated circuit 1 given as an example in the embodiment. For example, the three-dimensional integrated circuit 1 may be modified as follows.

(1) In the above embodiment, the wiring pattern is formed while the center line parallel to the sides of the wiring layer 14 serving as the symmetry axis Y, as shown in FIGS. 2 to 4. However, the wiring pattern of the wiring layer 14 is not limited to such and may be different as long as at least the power conductor areas 103 and the ground conductor areas 104 of one of the two semiconductor chips 10 respectively face the ground conductor areas 104 and the power conductor areas 103 of the other, when the two semiconductor chips 10 are bonded to each other.

For example, as shown in FIG. 5, in the case of a semiconductor chip 10a whose wiring layer 14 is in the shape of a square, a diagonal line bd of the square may serve as the symmetry axis Y.

FIG. 5 shows the semiconductor chips 10a of the same type in line. In the insets (a) and (b) of FIG. 5, the insulation layer 13 is not shown.

In the wiring layer 14, the power conductor areas 103 and the ground conductor areas 104 are arranged symmetrically to each other with respect to the diagonal line bd as being the symmetry axis Y. Also, in the wiring layer 14, the power vias 106 are arranged symmetrically to each other with respect to the diagonal line bd as the symmetry axis Y. Also, in the wiring layer 14, the ground vias 107 are arranged symmetrically to each other with respect to the diagonal line bd as the symmetry axis Y. Also, in the wiring layer 14, the transmission vias 108 and the reception vias 109 are arranged symmetrically to each other with respect to the diagonal line bd as the symmetry axis Y.

The three-dimensional integrated circuit 1 is manufactured by flipping the semiconductor chip 10a shown in FIG. 5(b) upside down by rotating the semiconductor chip 10a about the center line X parallel to the symmetry axis Y (i.e., diagonal line bd), and thereafter bonding the semiconductor chip 10a thus rotated to the semiconductor chip 10a shown in FIG. 5(a). In this way, the power conductor areas 103 face the ground conductor areas 104 with the insulation layers 13 therebetween, thus forming the decoupling capacitors inside the three-dimensional integrated circuit 1.

(2) In the above embodiment, the three-dimensional integrated circuit 1 is made up of the two semiconductor chips 10 that are bonded to each other without an offset. In other words, the three-dimensional integrated circuit 1 is formed by bonding an entire surface of the insulation layer 13 of one of the semiconductor chips 10 to an entire surface of the insulation layer 13 of the other.

However, a three-dimensional integrated circuit according to the present invention does not always need to be formed by bonding together the entire surfaces of the respective insulation layers 13. For example, only 25% or 50% of the total area of each insulation layer 13 may be bonded to each other, as long as a decoupling capacitor is formed inside the circuit. The following describes a three-dimensional integrated circuit according to a modification, with reference to FIGS. 6 and 7.

As shown in FIG. 6(a), a three-dimensional integrated circuit 2 is formed by bonding two semiconductor chips 10b such that approximately 50% of the total area of each insulation layer 13 overlaps each other. FIG. 6(b) shows the three-dimensional integrated circuit 2 viewed from the direction by the arrow. Also, FIG. 6(c) schematically shows a wiring layer 14b of each of the upper and lower semiconductor chips 10b. As shown in FIG. 6(c), suppose that S denotes the interface between the two semiconductor chips 10b, the wiring layer 14b of each semiconductor chip 10b includes the power conductor area 103 and the ground conductor area 104 that are arranged symmetrically to each other with respect to the center line of the interface S as being the symmetry axis Y. In this way, when the two semiconductor chips 10b are bonded to each other as shown in FIG. 6(a), the power conductor area 103 and the ground conductor area 104 of one of the two semiconductor chips 10b respectively face the ground conductor area 104 and the power conductor area 103 of the other.

Also, as shown in FIG. 7(a), a three-dimensional integrated circuit 3 is formed by bonding two semiconductor chips 10c such that approximately 50% of the total area of each insulation layer 13 overlaps each other and that one of the two semiconductor chips 10c is rotated by 90 degrees.

FIG. 7(b) shows the three-dimensional integrated circuit 3 viewed from the direction by the arrow. Also, FIG. 7(c) schematically shows a wiring layer 14c of each of the upper and lower semiconductor chips 10c. As shown in FIG. 7(c), suppose that S denotes the interface between the two semiconductor chips 10c, the wiring layer 14c of each semiconductor chip 10c includes the power conductor area 103 and the ground conductor area 104 that are arranged symmetrically to each other with respect to a diagonal line of the interface S as being the symmetry axis Y. In this way, when the two semiconductor chips 10c are bonded to each other as shown in FIG. 7(a), the power conductor area 103 and the ground conductor area 104 of one of the two semiconductor chips 10c respectively face the ground conductor area 104 and the power conductor area 103 of the other.

Layering two semiconductor chips with an offset to form a three-dimensional integrated circuit as described above makes it easy to connect wiring lines to the semiconductor chips and to bond the three-dimensional integrated circuit to a substrate. Furthermore, heat generated by the three-dimensional integrated circuit can be effectively dissipated.

(3) In the above embodiment, the wiring pattern was formed such that when the two semiconductor chips 10 are bonded to each other, all the power conductor areas 103 in the wiring layers 14 face all the ground conductor areas 104 in the wiring layers 14. However, it is not limited to such. The wiring pattern may be formed such that when the two semiconductor chips 10 are bonded to each other, at least one of the power conductor areas 103 in the wiring layers 14 face at least one of the ground conductor areas 104.

Figure 8:
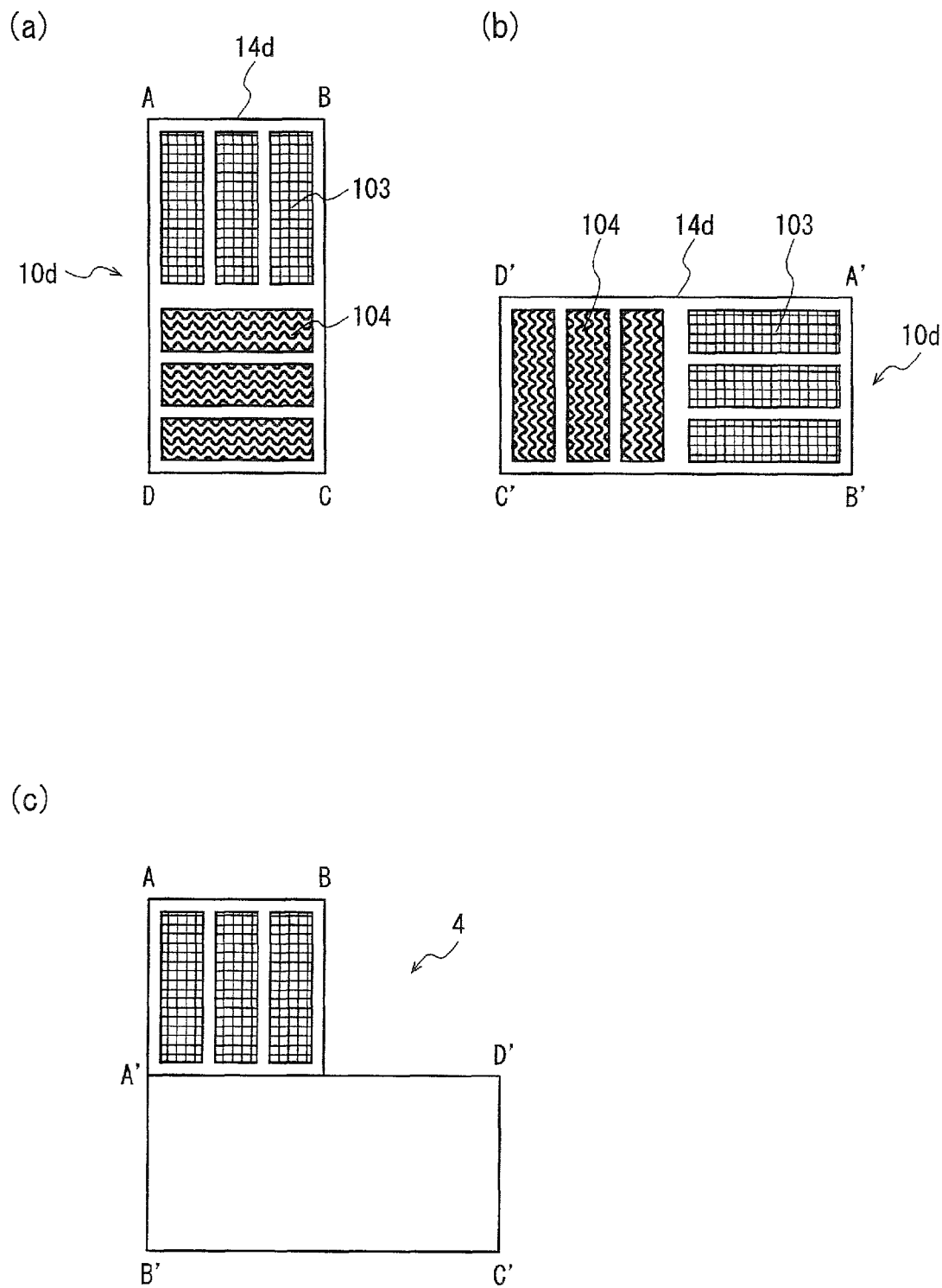
FIG. 8 is for explaining a three-dimensional integrated circuit 4 according to a modification.

For example, as shown in FIG. 8, a wiring layer 14d of each semiconductor chip 10d includes the power conductor areas 103 and the ground conductor areas 104. FIG. 8(b) shows the semiconductor chip 10d rotated by 90 degrees in the plane of FIG. 8 from the state shown in FIG. 8(a). As shown in FIG. 8(c), a three-dimensional integrated circuit 4 may be formed by flipping the semiconductor chip 10d in FIG. 8(b) upside down and bonding the semiconductor chip 10d thus flipped to the semiconductor chip 10d shown in FIG. 8(a). In the three-dimensional integrated circuit 4, 50% of all the conductor areas in each wiring layer 14d face each other.

As described above, each wiring layer 14d includes both the power conductor areas 103 and the ground conductor areas 104. In this way, when the two semiconductor chips 10d are bonded to each other, at least one of the power conductor areas 103 can face at least one of the ground conductor areas 104.

(4) In the above embodiment, the insulation layer 13 of each of the two semiconductor chips 10, which is provided at the interface therebetween, is made of $SiO_2$. However, the structure of a three-dimensional integrated circuit according to the present invention is not limited to such. The following describes a three-dimensional integrated circuit 5 as a modification of the three-dimensional integrated circuit 1.

Figure 9:
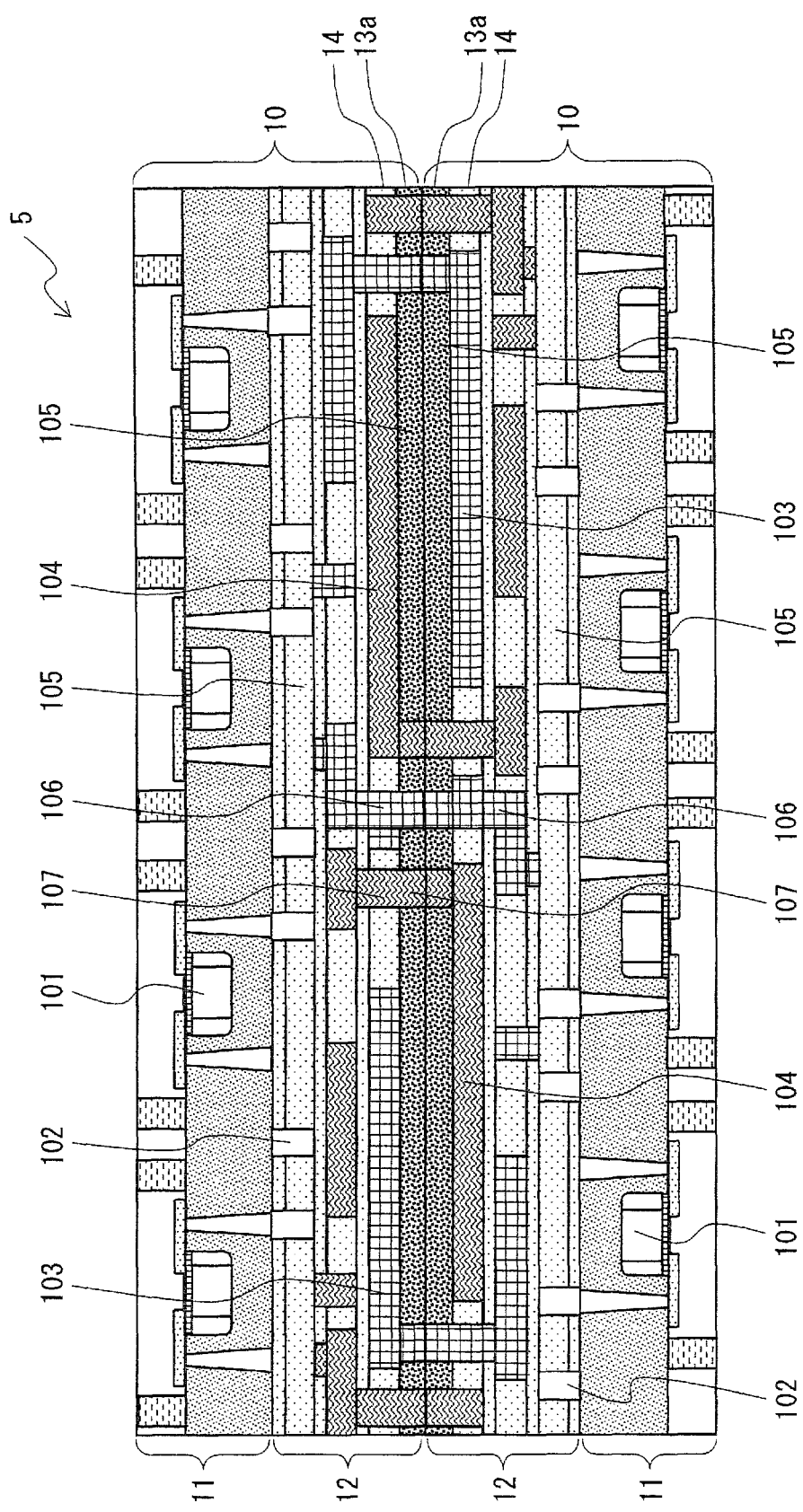
FIG. 9 is a schematic diagram showing a partial cross-section of a three-dimensional integrated circuit 5 having an insulation layer made of a high-k material according to a modification.

FIG. 9 schematically shows a partial cross-section of the three-dimensional integrated circuit 5. The three-dimensional integrated circuit 5 includes two semiconductor chips 10. In FIG. 9, the same reference signs have been provided for the same members as those of the three-dimensional integrated circuit 1 shown in FIG. 1. The following describes the differences from the three-dimensional integrated circuit 1.

The multilayer wiring layer 12 of each semiconductor chip 10 includes three wiring layers and an insulation layer 13a. In the present modification, the interlayer insulation film in each wiring layer is made of $SiO_2$, similarly to the above embodiment. However, the insulation layer 13a is made of a high dielectric (high-k material).

As described above, the three-dimensional integrated circuit 5 includes the insulation layer 13a which is made of a high-k material, and this insulation layer 13a is sandwiched by the power conductor area 103 and the ground conductor area 104. This enables forming a decoupling capacitor having a larger capacitance, inside the three-dimensional integrated circuit 5. Note that the interlayer insulation film 105 may be made of a low-k material. As described above, the interlayer insulation film 105 made of a low-k material prevents coupling capacitors from being formed between wiring lines, and also reduces wiring delay.

(5) In the above embodiment, the three-dimensional integrated circuit 1 is made up of the two semiconductor chips 10 of the same type. However, regarding each of the two semiconductor chips in the three-dimensional integrated circuit, at least the wiring layer 14 closest to the interface with the other chip may have the same structure, and the other wiring layers and/or the transistor layer do not always have to have the same structure.

For example, the three-dimensional integrated circuit 1 may be composed of two semiconductor chips, in which the multilayer wiring layers 12 have the same structure and the transistor layers 11 have different structures from each other.

Figure 10:
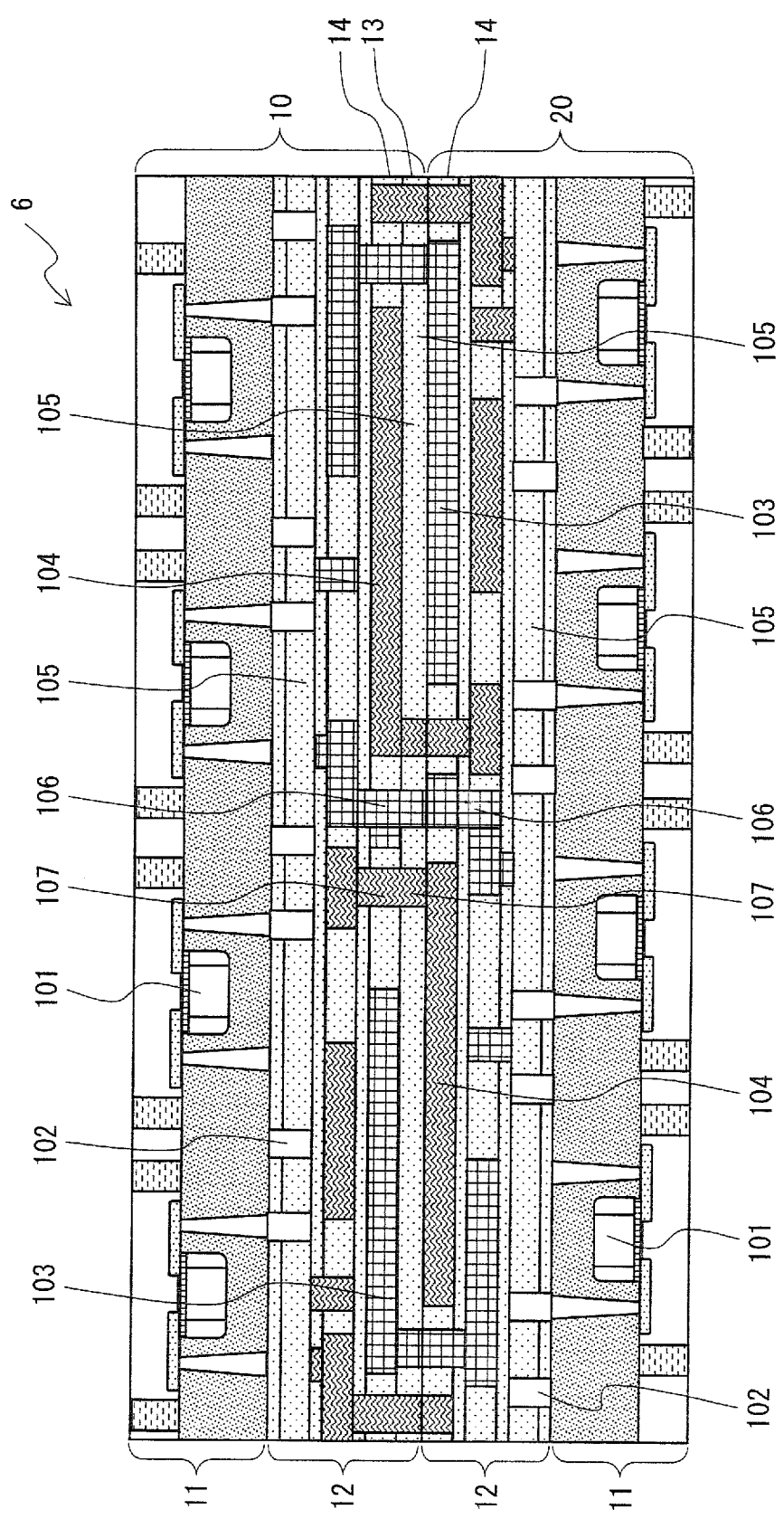
FIG. 10 is a schematic diagram showing a partial cross-section of a three-dimensional integrated circuit 6 according to a modification.

Also, as shown in a three-dimensional integrated circuit 6 shown in FIG. 10, one of the two semiconductor chips may be the semiconductor chip 10 whose structure is described in the above embodiment, and the other may be a semiconductor chip 20 which does not include the insulation layer 13 at the interface with the semiconductor chip 10. Even in the case of the three-dimensional integrated circuit 6, the power conductor areas 103 and the ground conductor areas 104 in the wiring layer 14 of the semiconductor chip 10 respectively face the ground conductor areas 104 and the power conductor areas 103 in the wiring layer 14 of the semiconductor chip 20, via the insulation layer 13 of the semiconductor chip 10, thus forming decoupling capacitors inside the three-dimensional integrated circuit 6.

(6) In the above embodiment, the wiring pattern of each wiring layer 14 is formed such that when the two semiconductor chips 10 are bonded to each other, the transmission vias 108 and the reception vias 109 of one of the wiring layers 14 are respectively connected to the reception vias 109 and the transmission vias 108 of the other.

However, if control circuits can control the input/output direction of data, data vias (i.e., transmission vias and reception vias) can serve as either transmission vias or reception vias depending on the intended use. In this case, it is not necessary to consider the layout of the data vias. The data vias that can serve as either transmission vias or reception vias depending on the intended use as described above are hereinafter referred to as "programmable vias".

Figure 11:
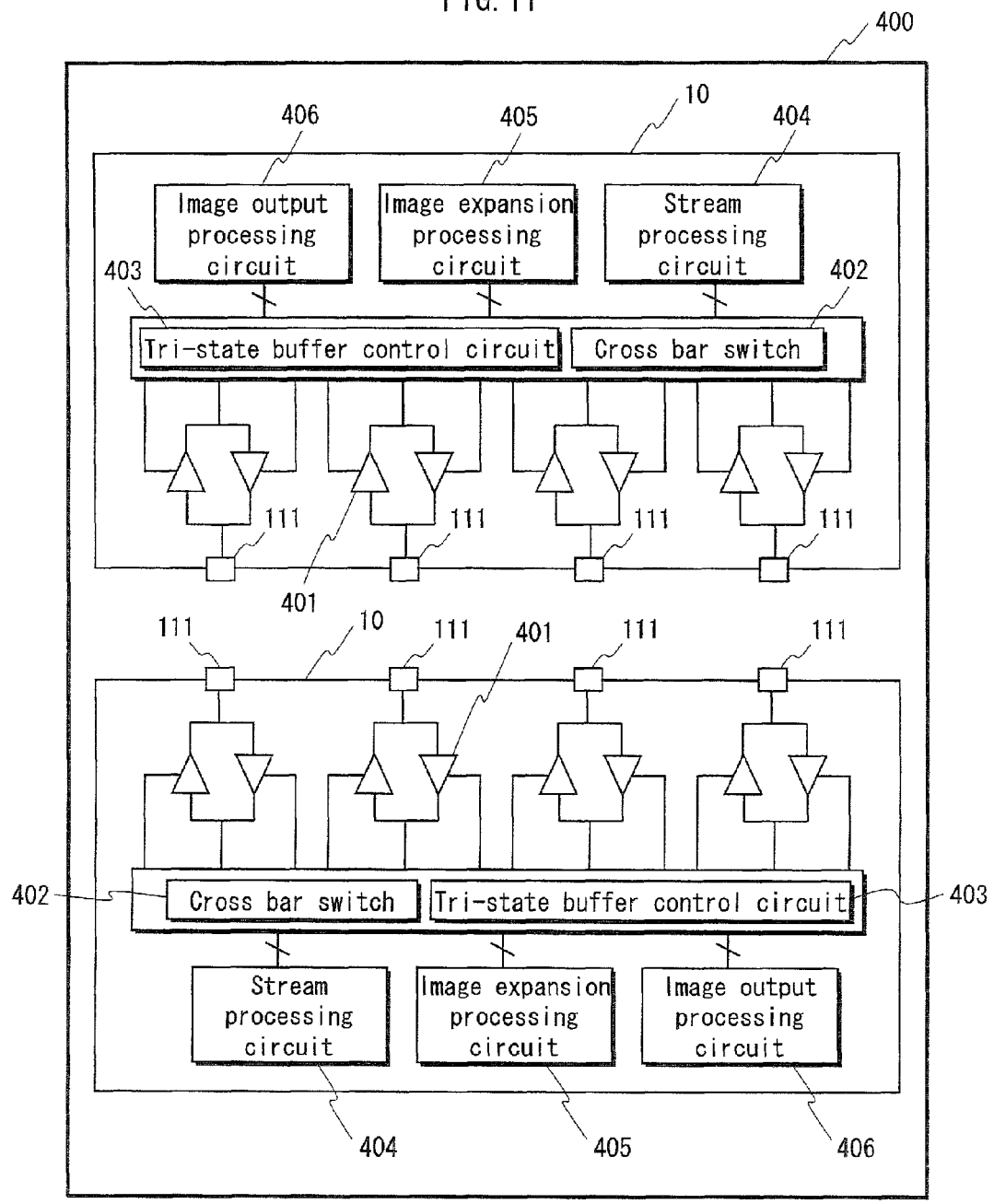
FIG. 11 is for explaining a signal via of a three-dimensional integrated circuit 400 used in a stream playback device.

FIG. 11 shows a specific example of the connection between the programmable vias, the control circuits, and internal circuits. A three-dimensional integrated circuit 400 in FIG. 11 includes two semiconductor chips 10 of the same type that are bonded to each other.

The semiconductor chips 10 are used, for example, in a stream playback device for generating an image from received stream data and outputting the image to an external device. Each of the semiconductor chips 10 includes: a plurality of programmable vias 111; a control circuit made up of a plurality of tri-state buffers (three-state buffers) 401, a cross bar switch circuit 402, and a tri-state buffer control circuit 403; and a main circuit made up of a stream control circuit 404, an image expansion processing circuit 405, and an image output processing circuit 406.

As shown in FIG. 11, each of the programmable vias 111 is connected to two of the tri-state buffers 401, one for transmission and the other for reception, thereby realizing bidirectional communication between the upper chip and the lower chip.

The stream control circuit 404 analyzes the packets of stream data. The image expansion processing circuit 405 decodes a video stream that has been compressed and encoded in accordance with an image compression standard such as MPEG-2 or H.264, and thereby obtains images. The image output processing circuit 406 outputs the images thus decoded to a panel control circuit (not shown).

For example, suppose that images decoded by the image expansion processing circuit in the upper semiconductor chip 10 in FIG. 11 are displayed by an external panel (not shown) via the lower semiconductor chip 10. In this case, it is necessary to transmit data from the image expansion processing circuit 405 in the upper semiconductor chip 10 to the lower image output processing circuit 406 in the lower semiconductor chip 10.

Accordingly, the tri-state buffer control circuit 403 in the upper semiconductor chip 10 enables only the tri-state buffers 401 on the transmission side, whereas the tri-state buffer control circuit 403 in the lower semiconductor chip 10 enables only the tri-state buffers 401 on the reception side.

Furthermore, the cross bar switch circuit 402 in the upper semiconductor chip 10 controls a network switch to connect the programmable vias 111 to the image expansion processing circuit 405. Also, the cross bar switch circuit 402 in the lower semiconductor chip 10 controls a network switch to connect the programmable vias 111 to the image output processing circuit 406.

By the control as described above, the programmable vias 111 in the upper semiconductor chip 10 function as transmission vias, and the programmable vias 111 in the lower semiconductor chip 10 function as reception vias.

In the case of transmitting data from the lower semiconductor chip 10 to the upper semiconductor chip 10, the control opposite from the above control is performed so that the programmable vias 111 in the upper semiconductor chip 10 function as reception vias and the programmable vias 111 in the lower semiconductor chip 10 function as transmission vias.

By employing the programmable vias for the data vias as described above, signals can be flexibly transferred between the semiconductor chips.

(7) Each of the three-dimensional integrated circuits 1 to 6 may be connected to a substrate with use of any method.

Figure 12A:
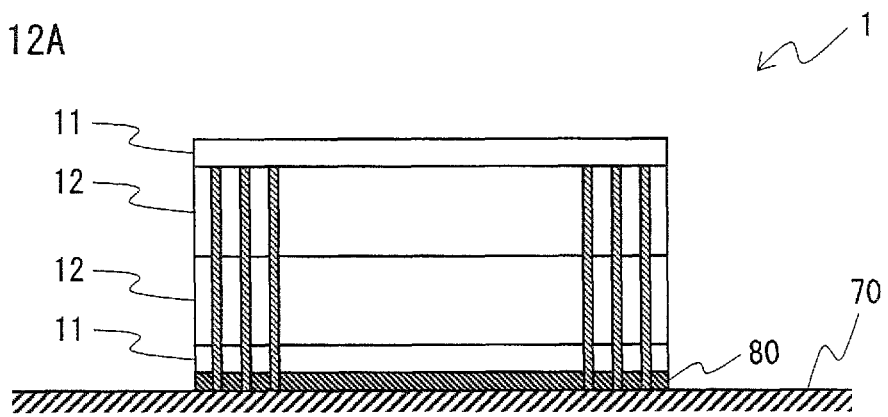
FIGS. 12A, 12B, and 12C each show a specific example of connecting the three-dimensional integrated circuit 1 to a substrate 70.

For example, as shown in FIG. 12A, an interposer 80 may be layered on a substrate 70 so as to connect the three-dimensional integrated circuit 1 to the substrate 70 via the interposer 80. In this case, power vias, ground vias, and data vias are formed in the interposer 80, and the chips of the three-dimensional integrated circuit 1 are connected to a regulator, ground electrode, and data terminal of the substrate 70, via the power vias, the ground vias, and the data vias.

Figure 12B:
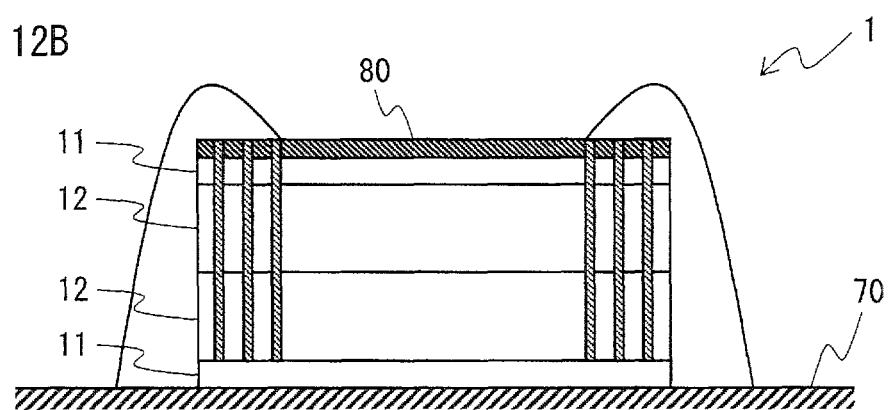

Also, as shown in FIG. 12B, the interposer 80 may be mounted on the upper semiconductor chip so as to connect the substrate 70 to the interposer 80 by means of wire bonding. The chips of the three-dimensional integrated circuit 1 are connected to the regulator, ground electrode, and data terminal of the substrate 70, via the power vias, the ground vias, and the data vias.

Figure 12C:
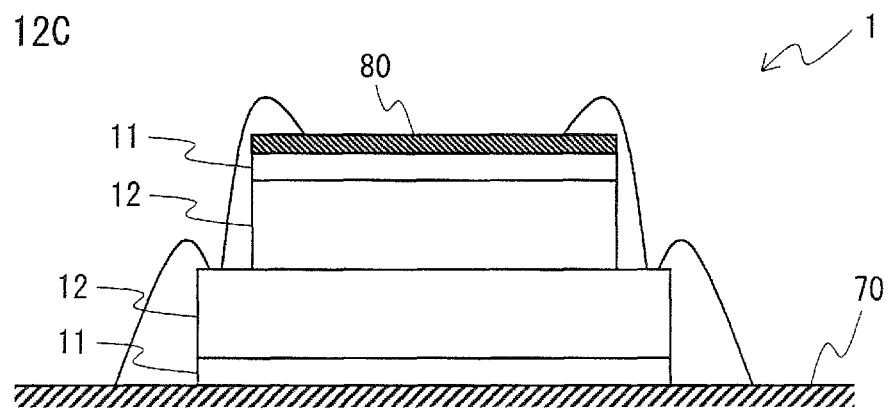

Also, as shown in FIG. 12C, two semiconductor chips that are different in size may be layered on each other, and each of the chips may be connected to the substrate 70 by means of two-tier wire bonding.

(8) In the above embodiment, the decoupling capacitors are formed with use of the power conductor areas 103 and the ground conductor areas 104 in the wiring layer 14 closest to the interface with the other chip. However, the present invention is not limited to such. Instead of being arranged in the wiring layer 14 closest to the interface with the other chip, the power conductor areas and the ground conductor areas may be arranged in a wiring layer positioned lower than the wiring layer 14. Then, the power conductor areas and the ground conductor areas in the lower wiring layer may respectively face the ground conductor areas and the power conductor areas in the other chip, with the wiring layer 14 and the insulation layer 13 therebetween.

(9) In the above embodiment, the three-dimensional integrated circuit 1 is made up of the two semiconductor chips 10 that are layered on each other. However, a three-dimensional integrated circuit according to the present invention, and a manufacturing method of the three-dimensional integrated circuit are not limited to the case of layering two semiconductor chips, but also include the case of layering more than two semiconductor chips.

(10) Specifically, the three-dimensional integrated circuit 1 described in the above embodiment may be a processor. According to the three-dimensional integrated circuit 1, the wiring length is short while the total area of the chips is large. Therefore, the three-dimensional integrated circuit 1 is useful as a high-performance processor. Also, since including the two or more semiconductor chips 10 of the same type, the three-dimensional integrated circuit 1 is also useful as a multi-core processor.

(11) Any combination of the above embodiment and modifications is acceptable as long as the combination is appropriate.

<Supplementary Remarks>

The following describes the structure of a three-dimensional integrated circuit as another aspect of the present invention, and also describes modifications and effects thereof.

The three-dimensional integrated circuit includes a first semiconductor chip and a second semiconductor chip that are layered on each other, wherein each of the first and second semiconductor chips includes a load layer and a plurality of wiring layers that are layered on each other, at least one of the first and second semiconductor chips includes an insulation layer for insulating the first and second semiconductor chips from each other at an interface therebetween, each of (i) a wiring layer closest to the interface among the wiring layers of the first semiconductor chip and (ii) a wiring layer closest to the interface among the wiring layers of the second semiconductor chip includes a power conductor area and a ground conductor area, a layout of the power conductor area and the ground conductor area in the wiring layer of the first semiconductor chip is the same as a layout of the power conductor area and the ground conductor area in the wiring layer of the second semiconductor chip, and the power conductor area in the wiring layer of the first semiconductor chip at least partially faces the ground conductor area in the wiring layer of the second semiconductor chip with the insulation layer therebetween.

The above structure enables forming a decoupling capacitor at the interface between the first semiconductor chip and the second semiconductor chip, without the need for a new structural member.

Also, both the power conductor area and the ground conductor area are formed in each of (i) the wiring layer closest to the interface among the wiring layers of the first semiconductor chip and (ii) the wiring layer closest to the interface among the wiring layers of the second semiconductor chip. Therefore, by bonding the first semiconductor chip to the second semiconductor chip with the insulation layer therebetween, the power conductor area in one of the first and second semiconductor chips is highly likely to face the ground conductor area of the other of the first and second semiconductor chips.

Also, in the manufacturing process of the first and second semiconductor chips, the aforementioned wiring layers of each chip can be manufactured in the same process.

In the three-dimensional integrated circuit, the first and second semiconductor chips may be of the same type, and may each include the insulation layer.

According to the above structure, it is sufficient to manufacture only a single type of semiconductor chip during the manufacturing process of the three-dimensional integrated circuit. This reduces design cost.

Regarding the three-dimensional integrated circuit, in the wiring layer of each of the first and second semiconductor chips that is closest to the interface, the power conductor area and the ground conductor area may be arranged symmetrically to each other with respect to a center line of the interface.

According to the above structure, even when the first semiconductor chip and the second semiconductor chips are layered on each other with an offset, a decoupling capacitor is formed at the interface between the two semiconductor chips.

In the three-dimensional integrated circuit, an entire surface of the insulation layer of the first semiconductor chip may be bonded to an entire surface of the insulation layer of the second semiconductor chip, so that the three-dimensional integrated circuit has a substantially rectangular parallelepiped shape, and in the wiring layer of each of the first and second semiconductor chips that is closest to the interface, the power conductor area and the ground conductor area may be arranged symmetrically to each other with respect to a center line of the wiring layer.

According to the above structure, the first semiconductor chip and the second semiconductor chip are bonded to each other without an offset. In this way, all the power conductor areas face all the ground conductor areas, resulting in larger decoupling capacitors being formed inside the circuit.

Regarding the three-dimensional integrated circuit, each of the first and second semiconductor chips may include a plurality of power vias and a plurality of ground vias, the power vias and the ground vias penetrating the corresponding insulating layer, the power vias being for bringing the power conductor areas in the first and second semiconductor chips into conduction, and the ground vias being for bringing the ground conductor areas in the first and second semiconductor chips into conduction, the power vias in each of the first and second semiconductor chips may be arranged symmetrically with respect to the center line of the corresponding wiring layer, and the ground vias in each of the first and second semiconductor chips may be arranged symmetrically with respect to the center line of the corresponding wiring layer.

According to the above structure, the power vias in the upper and lower semiconductor chips (i.e., first and second semiconductor chips) are connected to each other, and the ground vias in the upper and lower semiconductor chips are also connected to each other. This reduces the possibility of electrical shorting caused by the power vias making contact with the ground vias.

In the three-dimensional integrated circuit, each of the first and second semiconductor chips may include a plurality of transmission vias and a plurality of reception vias, the transmission vias and the reception vias penetrating the corresponding insulating layer and being for transferring data, and the transmission vias and the reception vias in each of the first and second semiconductor chips may be arranged symmetrically to each other with respect to the center line of the corresponding wiring layer.

According to the above structure, the transmission via and the reception via in the upper semiconductor chip are respectively connected to the reception via and the transmission via in the lower semiconductor chip. This enables data transfer between the upper semiconductor chip and the lower semiconductor chip.

Regarding the three-dimensional integrated circuit, in the wiring layer of each of the first and second semiconductor chips that is closest to the interface, the power conductor area and the ground conductor area may be arranged symmetrically to each other with respect to a diagonal line of the interface.

According to the above structure, even when one of the semiconductor chips is rotated by 90 degrees with respect to the horizontal direction of the other semiconductor chip, and whereby the two semiconductor chips are layered on each other with an offset, a decoupling capacitor can still be formed at the interface between the two semiconductor chips.

Regarding the three-dimensional integrated circuit, the load layers in the first and second semiconductor chips may be transistor layers having the same structure, each transistor layer including a plurality of transistors for realizing a predetermined function.

The above structure enables manufacturing a low-end apparatus and a high-end apparatus that have the same function, by mounting one of the semiconductor chips in the low-end apparatus and mounting the three-dimensional integrated circuit made up of two of the semiconductor chips in the high-end apparatus.

In the three-dimensional integrated circuit, the insulation layer included in the at least one of the first and second semiconductor chips may be a high dielectric film (high-k material film).

The use of the high dielectric film as described above enables forming a decoupling capacitor having an even larger capacitance.

Another aspect of the present invention is a processor including a three-dimensional integrated circuit. The three-dimensional integrated circuit includes a first semiconductor chip and a second semiconductor chip that are layered on each other, wherein each of the first and second semiconductor chips includes a load layer and a plurality of wiring layers that are layered on each other, at least one of the first and second semiconductor chips includes an insulation layer for insulating the first and second semiconductor chips from each other at an interface therebetween, each of (i) a wiring layer closest to the interface among the wiring layers of the first semiconductor chip and (ii) a wiring layer closest to the interface among the wiring layers of the second semiconductor chip includes a power conductor area and a ground conductor area, a layout of the power conductor area and the ground conductor area in the wiring layer of the first semiconductor chip is the same as a layout of the power conductor area and the ground conductor area in the wiring layer of the second semiconductor chip, and the power conductor area in the wiring layer of the first semiconductor chip at least partially faces the ground conductor area in the wiring layer of the second semiconductor chip with the insulation layer therebetween.

The above structure enables forming a decoupling capacitor at the interface between the first semiconductor chip and the second semiconductor chip. This makes it possible to stably provide supply voltage to the processor that operates at high speed.

Another aspect of the present invention is a semiconductor chip in a three-dimensional integrated circuit, the semiconductor chip comprising a load layer, a plurality of wiring layers, and an insulation layer that are layered on each other, wherein one of the wiring layers that is closest to the insulation layer includes a power conductor area and a ground conductor area that are arranged symmetrically to each other with respect to a center line of the wiring layer.

The above structure enables forming, inside the circuit, a decoupling capacitor made up of the power conductor area, the insulation layer, and the ground conductor area, by manufacturing the three-dimensional integrated circuit by bonding the insulation layer of the semiconductor chip to an insulation layer of another semiconductor chip having the same structure as the said semiconductor chip.

Another aspect of the present invention is a manufacturing method of a three-dimensional integrated circuit, comprising: a first step of manufacturing each of a first semiconductor chip and a second semiconductor chip by layering a load layer and a plurality of wiring layers, each of (i) a wiring layer closest to an intended interface between the first and second semiconductor chips among the wiring layers of the first semiconductor chip and (ii) a wiring layer closest to the intended interface among the wiring layers of the second semiconductor chip including a power conductor area and a ground conductor area, and a layout of the power conductor area and the ground conductor area in the wiring layer of the first semiconductor chip being the same as a layout of the power conductor area and the ground conductor area in the wiring layer of the second semiconductor chip; and a second step of bonding the first semiconductor chip to the second semiconductor chip such that the power conductor area in the wiring layer of the first semiconductor chip at least partially faces the ground conductor area in the wiring layer of the second semiconductor chip, wherein the first step further includes a substep of forming an insulation layer in at least one of the first and second semiconductor chips, the insulation layer being for insulating the first and second semiconductor chips from each other at the intended interface therebetween.

The above method is different from a conventional manufacturing method of a three-dimensional integrated circuit in that a decoupling capacitor made up of the power conductor area, the insulation layer, and the ground conductor area can be formed inside the circuit by simply bonding the first semiconductor chip to the second semiconductor chip with the insulation layer therebetween, without the need for any additional processing step.

Here, the first and second semiconductor chips may be of the same type, and in the first step of the manufacturing method, the insulation layer may be layered on each of the first and second semiconductor chips.

According to the above method, it is sufficient to manufacture only a single type of semiconductor chip during the first step. This reduces design cost.

INDUSTRIAL APPLICABILITY

The present invention is available as a technique for stabilizing the supply voltage of a semiconductor device, in the industry that manufactures and sells semiconductor devices that operate at high speed, such as processors.

REFERENCE SIGNS LIST 1, 2, 3, 4, 5, 6, and 400 three-dimensional integrated circuit
10, 10a, 10b, 10c, 10d, and 20 semiconductor chip
11 transistor layer
12 multilayer wiring layer
13 insulation layer
14, 14b, 14c, 14d wiring layer
70 substrate
80 interposer
101 transistor
102 wiring line
103 power conductor area
104 ground conductor area
105 interlayer insulation film
106 ground via
107 power via
108 transmission via
109 reception via
111 programmable via (data via)
401 tri-state buffer (three-state buffer)
402 cross bar switch circuit
403 tri-state buffer control circuit
404 stream control circuit
405 image expansion processing circuit
406 image output processing circuit

The invention claimed is:
1. A three-dimensional integrated circuit including a first semiconductor chip and a second semiconductor chip that are layered on each other, wherein
   each of the first and second semiconductor chips includes a load layer and a plurality of wiring layers that are layered on each other,
   at least one of the first and second semiconductor chips includes an insulation layer for insulating the first and second semiconductor chips from each other at an interface therebetween,
   each of (i) a wiring layer closest to the interface among the wiring layers of the first semiconductor chip and (ii) a wiring layer closest to the interface among the wiring layers of the second semiconductor chip includes a power conductor area and a ground conductor area,
   a layout of the power conductor area and the ground conductor area in the wiring layer of the first semiconductor chip is the same as a layout of the power conductor area and the ground conductor area in the wiring layer of the second semiconductor chip, and
   the power conductor area in the wiring layer of the first semiconductor chip at least partially faces the ground conductor area in the wiring layer of the second semiconductor chip with the insulation layer therebetween.
2. The three-dimensional integrated circuit of claim 1, wherein
   the first and second semiconductor chips are of the same type, and each include the insulation layer.
3. The three-dimensional integrated circuit of claim 2, wherein
   in the wiring layer of each of the first and second semiconductor chips that is closest to the interface, the power conductor area and the ground conductor area are arranged symmetrically to each other with respect to a center line of the interface.

4. The three-dimensional integrated circuit of claim 3, wherein an entire surface of the insulation layer of the first semiconductor chip is bonded to an entire surface of the insulation layer of the second semiconductor chip, so that the three-dimensional integrated circuit has a substantially rectangular parallelepiped shape, and in the wiring layer of each of the first and second semiconductor chips that is closest to the interface, the power conductor area and the ground conductor area are arranged symmetrically to each other with respect to a center line of the wiring layer.

5. The three-dimensional integrated circuit of claim 4, wherein each of the first and second semiconductor chips includes a plurality of power vias and a plurality of ground vias, the power vias and the ground vias penetrating the corresponding insulating layer, the power vias being for bringing the power conductor areas in the first and second semiconductor chips into conduction, and the ground vias being for bringing the ground conductor areas in the first and second semiconductor chips into conduction, the power vias in each of the first and second semiconductor chips are arranged symmetrically with respect to the center line of the corresponding wiring layer, and the ground vias in each of the first and second semiconductor chips are arranged symmetrically with respect to the center line of the corresponding wiring layer.

6. The three-dimensional integrated circuit of claim 4, wherein each of the first and second semiconductor chips includes a plurality of transmission vias and a plurality of reception vias, the transmission vias and the reception vias penetrating the corresponding insulating layer and being for transferring data, and the transmission vias and the reception vias in each of the first and second semiconductor chips are arranged symmetrically to each other with respect to the center line of the corresponding wiring layer.

7. The three-dimensional integrated circuit of claim 2, wherein in the wiring layer of each of the first and second semiconductor chips that is closest to the interface, the power conductor area and the ground conductor area are arranged symmetrically to each other with respect to a diagonal line of the interface.

8. The three-dimensional integrated circuit of claim 1, wherein the load layers in the first and second semiconductor chips are transistor layers having the same structure, each transistor layer including a plurality of transistors for realizing a predetermined function.

9. The three-dimensional integrated circuit of claim 1, wherein the insulation layer included in the at least one of the first and second semiconductor chips is a high dielectric film (high-k material film).

10. A processor including the three-dimensional integrated circuit of claim 1.

11. A semiconductor chip in a three-dimensional integrated circuit, the semiconductor chip comprising a load layer, a plurality of wiring layers, and an insulation layer that are layered on each other, wherein one of the wiring layers that is closest to the insulation layer includes a power conductor area and a ground conductor area that are arranged symmetrically to each other with respect to a center line of the wiring layer.

12. A manufacturing method of a three-dimensional integrated circuit, comprising:

a first step of manufacturing each of a first semiconductor chip and a second semiconductor chip by layering a load layer and a plurality of wiring layers, each of (i) a wiring layer closest to an intended interface between the first and second semiconductor chips among the wiring layers of the first semiconductor chip and (ii) a wiring layer closest to the intended interface among the wiring layers of the second semiconductor chip including a power conductor area and a ground conductor area, and a layout of the power conductor area and the ground conductor area in the wiring layer of the first semiconductor chip being the same as a layout of the power conductor area and the ground conductor area in the wiring layer of the second semiconductor chip; and a second step of bonding the first semiconductor chip to the second semiconductor chip such that the power conductor area in the wiring layer of the first semiconductor chip at least partially faces the ground conductor area in the wiring layer of the second semiconductor chip, wherein the first step further includes a substep of forming an insulation layer in at least one of the first and second semiconductor chips, the insulation layer being for insulating the first and second semiconductor chips from each other at the intended interface therebetween.

13. The manufacturing method of claim 12, wherein the first and second semiconductor chips are of the same type, and in the first step, the insulation layer is layered on each of the first and second semiconductor chips.

* * * * *